United States Patent
Mathea et al.

(10) Patent No.: US 7,968,887 B2
(45) Date of Patent: Jun. 28, 2011

(54) ACTIVE MATRIX CIRCUIT SUBSTRATE, METHOD OF MANUFACTURING THE SAME, AND ACTIVE MATRIX DISPLAY INCLUDING THE ACTIVE MATRIX CIRCUIT SUBSTRATE

(75) Inventors: Arthur Mathea, Berlin (DE); Jorg Fischer, Berlin (DE)

(73) Assignees: Samsung Mobile Display Co., Ltd., Yongin (KR); Samsung SDI Germany GmbH, Berlin (DE)

( * ) Notice: Subject to any disclaimer, the term of this patent is extended or adjusted under 35 U.S.C. 154(b) by 0 days.

(21) Appl. No.: 11/279,809

(22) Filed: Apr. 14, 2006

(65) Prior Publication Data
US 2006/0240603 A1    Oct. 26, 2006

(30) Foreign Application Priority Data

Apr. 21, 2005  (EP) .................................. 05103239
Aug. 31, 2005  (KR) ....................... 10-2005-0080713

(51) Int. Cl.
*H01L 27/14* (2006.01)
(52) U.S. Cl. ............... 257/72; 257/59; 257/E51.024; 257/E51.019; 257/E21.002
(58) Field of Classification Search ............ 257/72, 257/59, E51.024, E51.019, E21.002
See application file for complete search history.

(56) References Cited

U.S. PATENT DOCUMENTS

| | | | |
|---|---|---|---|
| 5,076,666 A * | 12/1991 | Katayama et al. | 349/55 |
| 5,708,483 A * | 1/1998 | Asai | 349/38 |
| 2002/0105614 A1 | 8/2002 | Nakayama et al. | |
| 2003/0141500 A1 | 7/2003 | Amundson et al. | |
| 2004/0101100 A1 * | 5/2004 | Morii et al. | 378/98.7 |
| 2004/0109101 A1 * | 6/2004 | Kim et al. | 349/44 |

FOREIGN PATENT DOCUMENTS

| | | |
|---|---|---|
| CN | 1518774 | 8/2004 |
| CN | 100585853 | 1/2010 |
| JP | 08-179362 A1 | 7/1996 |
| JP | 08-318975 | 12/1996 |
| JP | 2001-305580 A1 | 10/2001 |
| JP | 2002-151522 | 5/2002 |
| WO | WO 01/17029 A1 | 3/2001 |
| WO | WO 2004/070466 A2 | 8/2004 |

* cited by examiner

*Primary Examiner* — Bradley K Smith
*Assistant Examiner* — Mohammad T Karimy
(74) *Attorney, Agent, or Firm* — H.C. Park & Associates, P.L.C.

(57) ABSTRACT

An active matrix circuit substrate including data lines, select lines, and pixel circuits electrically coupled with a data line and two adjacent select lines. The pixel circuits include a thin film transistor having a gate electrode coupled with one of the two adjacent select lines and a storage capacitor having a second electrode coupled with the other select line adjacent to the select line to which the gate electrode is coupled. The gate electrode of a first pixel circuit and the second electrode of the storage capacitor of the adjacent pixel circuit are the same structure having a line shape.

9 Claims, 9 Drawing Sheets

ACTIVE MATRIX CIRCUIT SUBSTRATE, METHOD OF MANUFACTURING THE SAME, AND ACTIVE MATRIX DISPLAY INCLUDING THE ACTIVE MATRIX CIRCUIT SUBSTRATE

CROSS-REFERENCE TO RELATED APPLICATION

This application claims priority to and the benefit of European Patent Application No. 05 103 239.9, filed on Apr. 21, 2005, in the European Patent Office, and Korean Patent Application No. 10-2005-0080713, filed on Aug. 31, 2005, in the Korean Intellectual Property Office, which are hereby incorporated by reference for all purposes as if fully set forth herein.

BACKGROUND OF THE INVENTION

1. Field of the Invention

The present invention relates to an active matrix circuit substrate, a method of manufacturing the same, and an active matrix display including the active matrix circuit substrate. More particularly, the present invention relates to a simple and flexible active matrix circuit substrate, a method of manufacturing the same, and an active matrix display including the active matrix circuit substrate.

2. Discussion of the Background

Generally, organic circuits such as organic active matrix circuits for flat panel displays have recently become more important. However, they are still relatively expensive. Thus, a need remains to fabricate displays with low-cost manufacturing processes.

WO 99/53371 discloses a display having an organic thin film transistor (TFT) matrix with a display medium of microencapsulated electrophoretic particles.

WO 03/98696 discloses the use of a lithographic technique to provide a patterned layer and a method of depositing a semiconductor material on localized regions using inkjet printing.

US 2003/0059975 discloses a method of confining inkjet-printed semiconductors on hydrophobic and hydrophilic surface areas of a substrate. According to the method, a surface of the substrate is patterned to confine ink to either the hydrophobic surface areas or the hydrophilic surface areas.

In the aforementioned background art, the manufacture of active matrix circuits may require a lot of expensive patterning operations to define organic TFTs, storage capacitors, and signal lines (e.g., data lines and select lines).

SUMMARY OF THE INVENTION

The present invention provides an active matrix circuit substrate that may be cheaper to fabricate, uses less patterning processes, and is suitable for flexible displays.

The present invention also provides a method of manufacturing an active matrix circuit substrate at a lower cost.

Additional features of the invention will be set forth in the description which follows, and in part will be apparent from the description, or may be learned by practice of the invention.

The present invention discloses an active matrix circuit substrate including data lines, select lines, and pixel circuits electrically coupled with a data line and first and second select lines. The pixel circuits include a thin film transistor having a gate electrode coupled with the first select line and a source electrode and a drain electrode, one of the source and drain electrodes being coupled with the data line, and a storage capacitor having a first electrode coupled with the other of the source and drain electrodes and a second electrode coupled with the second select line. The gate electrode of a first pixel circuit and the second electrode of the storage capacitor of an adjacent pixel circuit are the same structure having a line shape.

The present invention also discloses a method of manufacturing an active matrix circuit substrate, including forming data lines, first electrodes of storage capacitors of a plurality of pixel circuits, and source electrodes and drain electrodes of thin film transistors of the pixel circuits on a substrate. A semiconductor layer is formed between the source electrodes and the drain electrodes, and an insulating film is formed over the source electrodes, the drain electrodes, the semiconductor layer, and the first electrodes. Select lines, second electrodes of the storage capacitors of the pixel circuits, and gate electrodes of the thin film transistors of the pixel circuits are formed on the insulating film. The gate electrode of a first pixel circuit and the second electrode of the storage capacitor of an adjacent pixel circuit are formed of a conductive material and are the same structure having a line shape.

The present invention also discloses an active matrix display including data lines, select lines, pixel circuits electrically coupled with a data line, a first select line, and a second select line, and display elements electrically coupled with the pixel circuits. The display elements include a first pixel electrode and a second pixel electrode. The pixel circuits include a thin film transistor having a gate electrode coupled with the first select line and a source electrode and a drain electrode, one of the source and drain electrodes being coupled with the data line, and a storage capacitor having a first electrode coupled with the other of the source electrode and the drain electrode and a second electrode coupled with the second select line. The gate electrode of a first pixel circuit and the second electrode of the storage capacitor of an adjacent pixel circuit are the same structure having a line shape.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
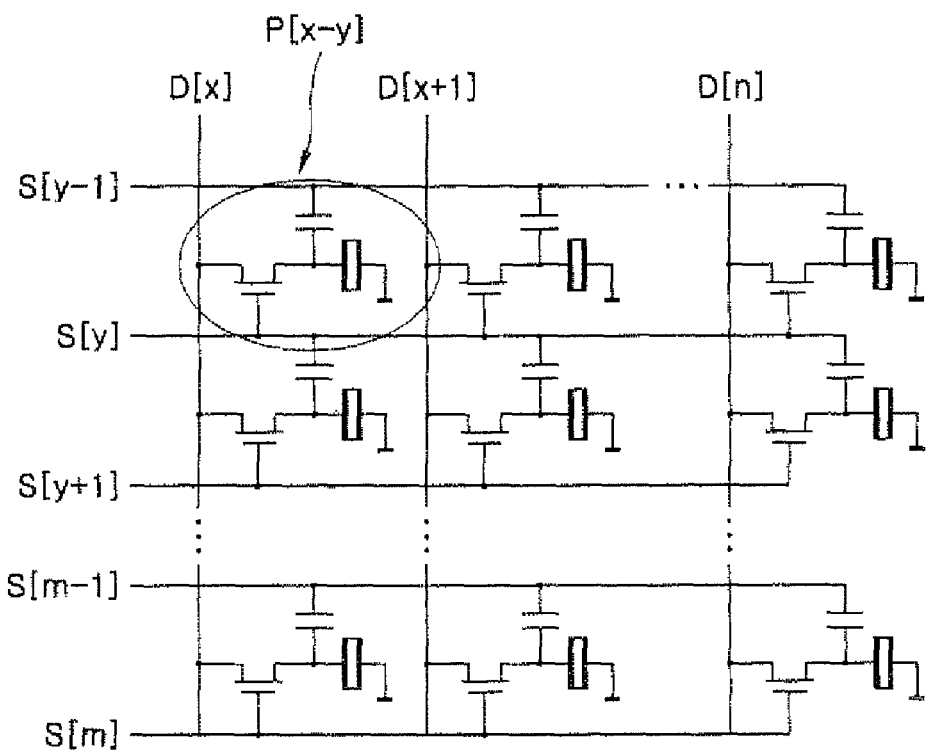
FIG. 1 is a schematic circuit diagram showing pixel circuits of an active matrix display according to an exemplary embodiment of the present invention.

The present invention will now be described more fully with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a schematic circuit diagram showing pixel circuits of an active matrix display according to an exemplary embodiment of the present invention. Referring to FIG. 1, the active matrix display comprises n data lines D and m select lines S. Reference sign P[x-y] denotes the pixel in the $x^{th}$ column and the $y^{th}$ row of the active matrix display.

Figure 2:
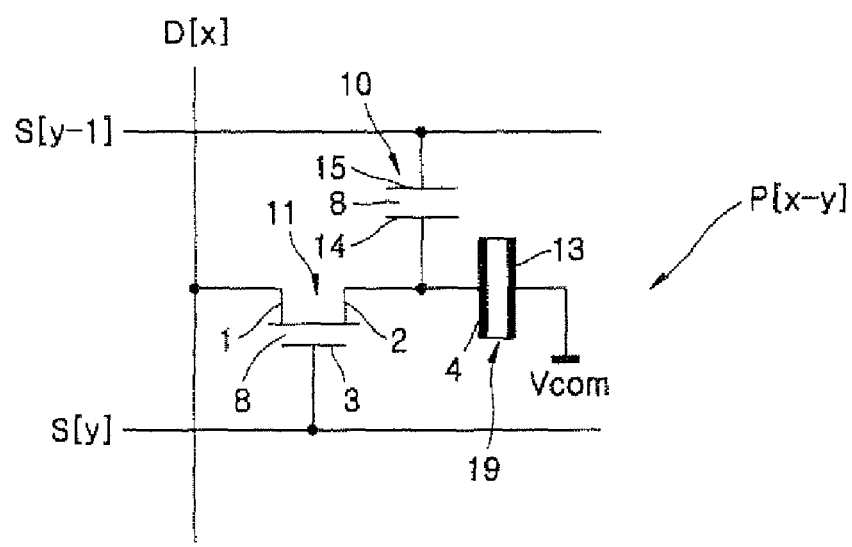
FIG. 2 is a circuit diagram showing a circuit of a pixel P[x-y] of FIG. 1.

FIG. 2 is a circuit diagram showing a circuit of the pixel P[x-y] in greater detail. The circuit of the pixel P[x-y] is electrically coupled with a data line D[x] and two adjacent select lines S[y−1] and S[y].

The circuit of the pixel P[x-y] includes an organic thin film transistor (TFT) 11, which includes a source electrode 1, a drain electrode 2, a gate electrode 3, a semiconductor layer (not shown in FIG. 2) arranged between the source electrode 1 and the drain electrode 2, and an insulation film 8 arranged between the gate electrode 3 and the semiconductor layer. The circuit of the pixel P[x-y] further includes a storage capacitor 10, which includes a first electrode 14, a second electrode 15, and an insulating film 8 arranged between the first and second electrodes 14 and 15, and a display element 19, which includes a first pixel electrode 4 and a second pixel electrode 13. The display element 19 includes a functional layer 21 (not shown in FIG. 2) according to the element's type. If the display element 19 is an electrophoretic element, it includes a functional layer including particles that may be controlled by an electrical field and that is arranged between the first and second pixel electrodes 4 and 13. The functional layer 21 may alternatively be an electrochrome functional layer or a liquid crystal display functional layer.

The second pixel electrode 13 is coupled with a common potential Vcom. The source electrode 1 of the organic TFT 11 is coupled with the data line D[x] of the $x^{th}$ column. The gate electrode 3 of the organic TFT 11 is coupled with the select line S[y] of the $y^{th}$ row. The drain electrode 2 of the organic TFT 11 is coupled with the first electrode 14 of the storage capacitor 10 and the first pixel electrode 4 of the display element 19. The second electrode 15 of the storage capacitor 10 is coupled with the select line S[y−1] of the $(y−1)^{th}$ row.

Figure 3A:
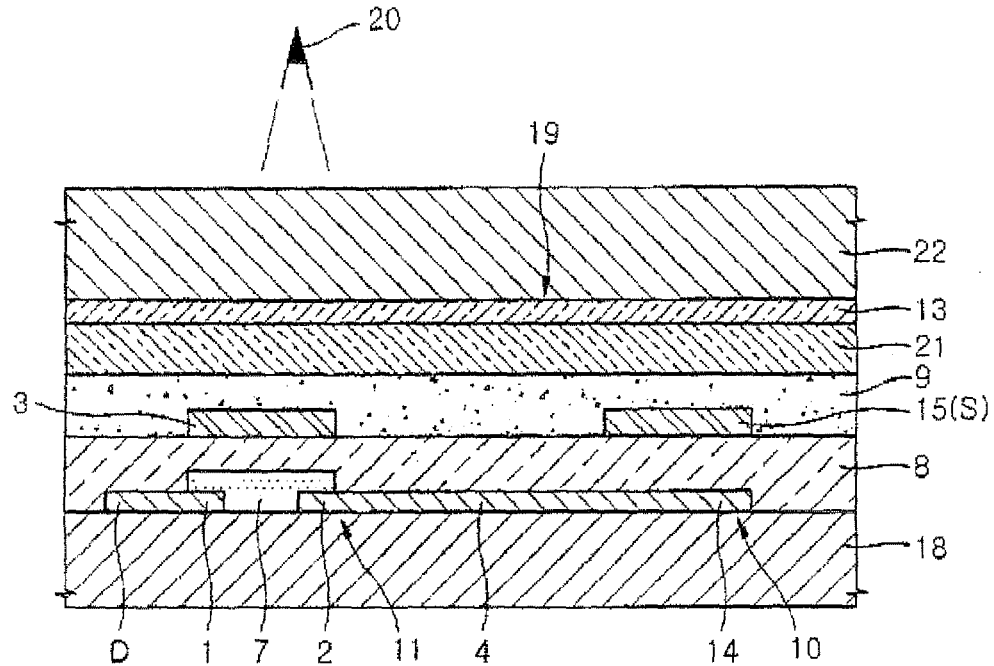
FIG. 3A and FIG. 3B are cross-sectional views of the active matrix display of FIG. 1.

The circuit of the pixel P[x-y] may have a cross-section as shown in FIG. 3A. The data line D, the source electrode 1, the drain electrode 2, the first pixel electrode 4, and the first electrode 14 of the storage capacitor 10 are arranged on a first substrate 18. A semiconductor layer 7 is arranged between the source electrode 1 and the drain electrode 2, and the insulating film 8 is arranged over the resultant structure. The gate electrode 3, the second electrode 15 of the storage capacitor 10, and a select line S, which is coupled with the second electrode 15, are arranged on the insulating film 8. A buffer layer 9 covers the insulating film 8, the second electrode 15, and the select line S. The functional layer 21, the second pixel electrode 13, and a second substrate 22 for use as a carrier substrate, which constitute the display element 19, are sequentially arranged on the buffer layer 9. Light reflected by the display element 19 may be perceived by an observer 20.

Figure 3B:
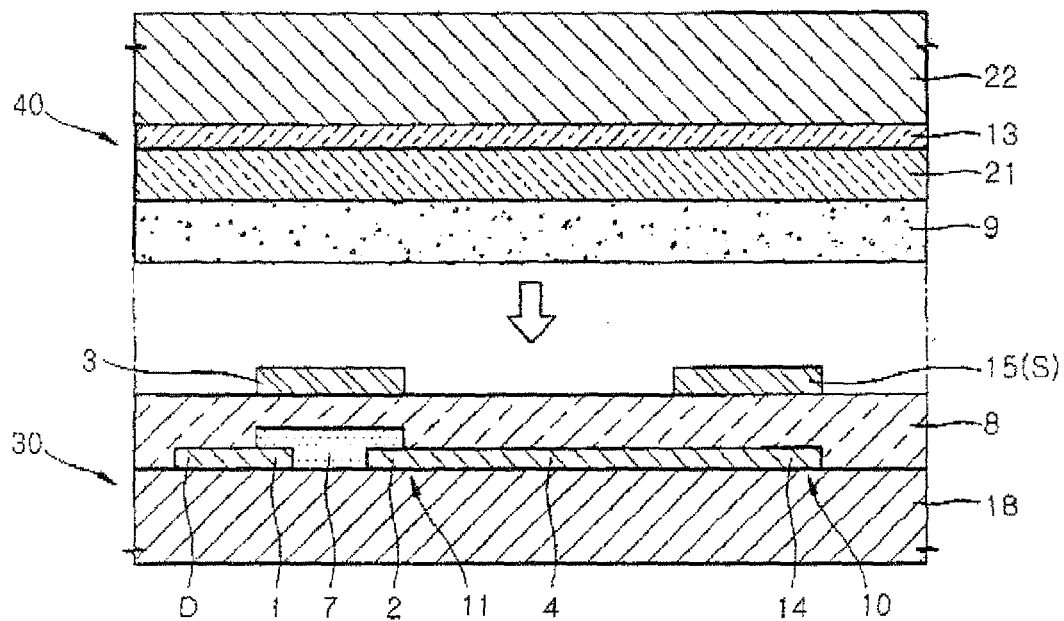

FIG. 3B shows the active matrix display in a two-part form. The first pixel electrode 4 is a part of an active matrix circuit substrate 30, which includes the components 1, 2, 3, 4, 5, 7, 8, 10, 11, 12, 14, 15, and 18. The second pixel electrode 13 is a part of a display substrate 40, which includes the components 9, 13, 21, and 22.

As shown in FIG. 3B, the active matrix display device includes the active matrix circuit substrate 30 and the display substrate 40. Referring to FIG. 3B, the display substrate 40 may be laminated onto the active matrix circuit substrate 30 (illustrated by the arrow), thereby forming the active matrix display device. Although the buffer layer 9 is shown included in the display substrate 40 of FIG. 3B, it may be included in the active matrix circuit substrate 30 or in both the display substrate 40 and the active matrix circuit substrate 30.

A structural feature of embodiments of the present invention will now be described in detail with reference to FIG. 4A, FIG. 4B, FIG. 5A, FIG. 5B, FIG. 6A, FIG. 6B, FIG. 7A and FIG. 7B, which show a process for manufacturing the active matrix circuit substrate 30 of the active matrix display device.

Figure 4A:
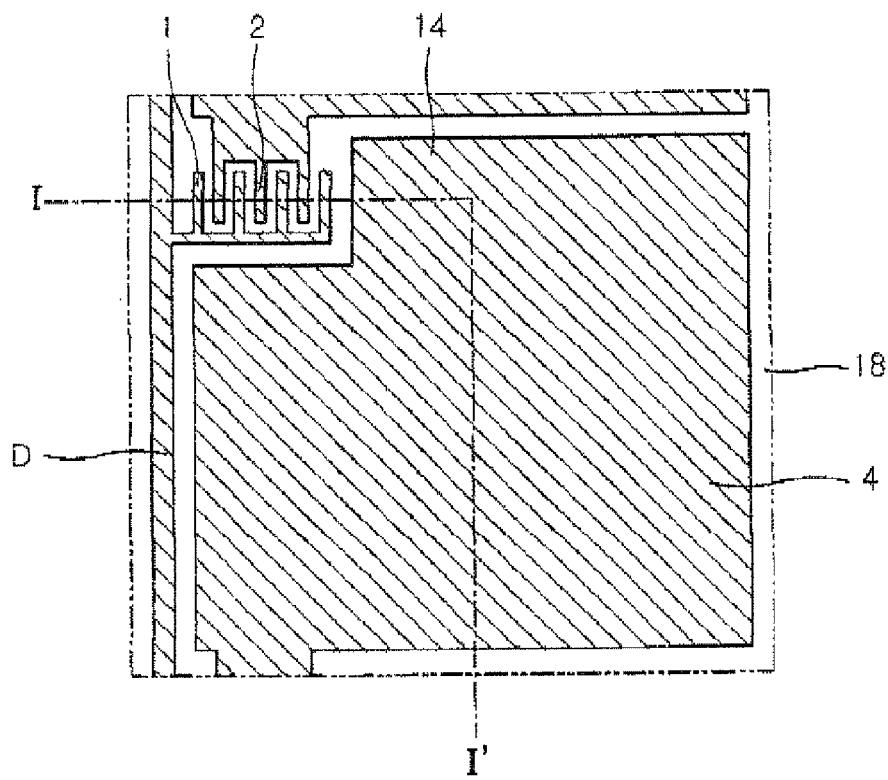
FIG. 4A is a plan view of a pixel for showing an operation of forming a first pixel electrode, a source electrode, a drain electrode, a first electrode of a storage capacitor, and a data line of a pixel of the active matrix display of FIG. 1.
Figure 4B:
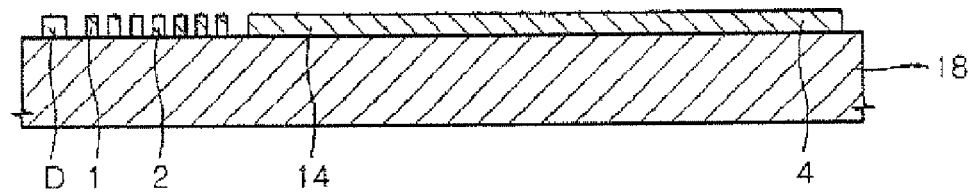
FIG. 4B is a cross-sectional view along line I-I' of FIG. 4A.

FIG. 4A shows, in a plan view, an operation of forming the first pixel electrode 4, the source electrode 1, the drain electrode 2, the first electrode 14 of the storage capacitor 10, and a data line D on the first substrate 18 in the manufacture of the active matrix circuit substrate 30. FIG. 4B is a cross-sectional view along line I-I' of FIG. 4A. The source electrode 1 and the drain electrode 2 are interdigitated to provide a high-performance TFT. The first pixel electrode 4, the first electrode 14 of the storage capacitor 10, the source electrode 1, and the drain electrode 2 may be formed side by side on a single layer. Alternatively, the first pixel electrode 4, the first electrode 14 of the storage capacitor 10, the source electrode 1, and the drain electrode 2 may be obtained by patterning the identical material.

Figure 5A:
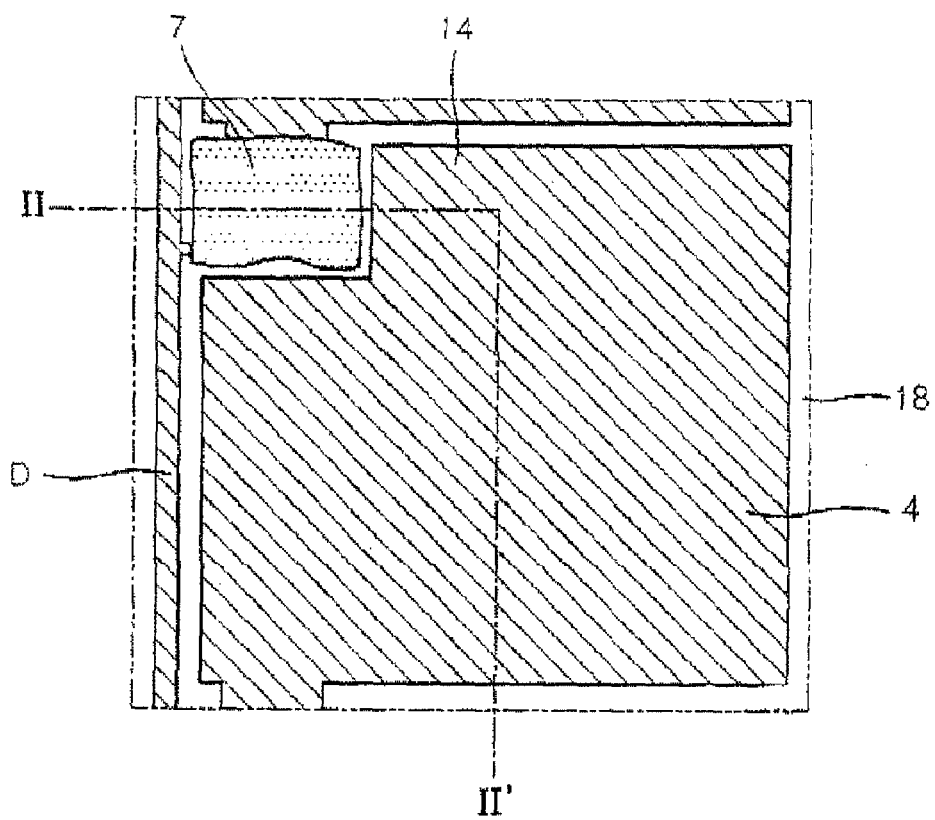
FIG. 5A is a plan view of a pixel for showing an operation of forming a semiconductor layer of the pixel of the active matrix display of FIG. 1.
Figure 5B:
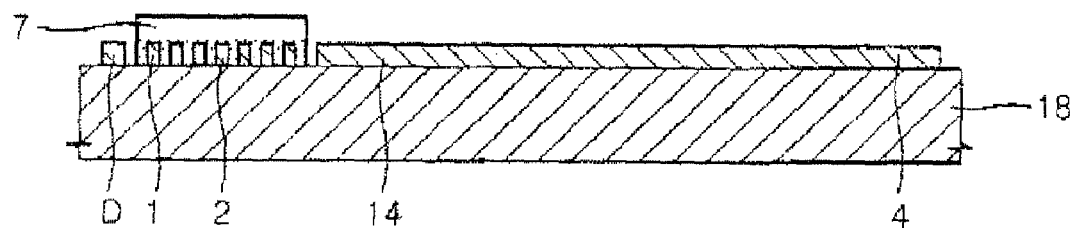
FIG. 5B is a cross-sectional view along line II-II' of FIG. 5A.
Figure 6A:
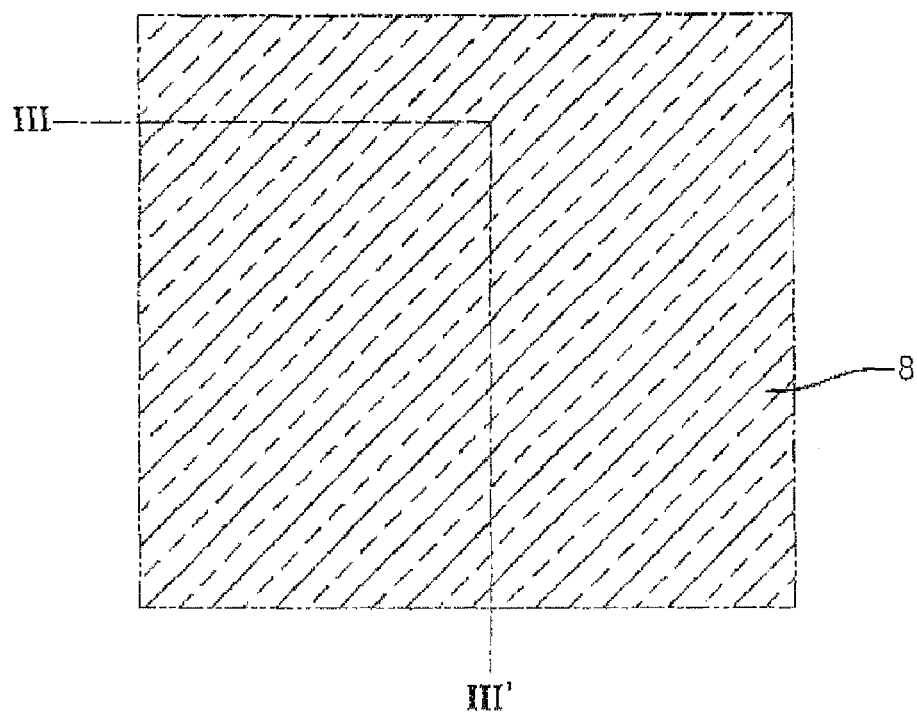
FIG. 6A is a plan view of a pixel for showing an operation of forming an insulation film of the pixel of the active matrix display of FIG. 1.
Figure 6B:
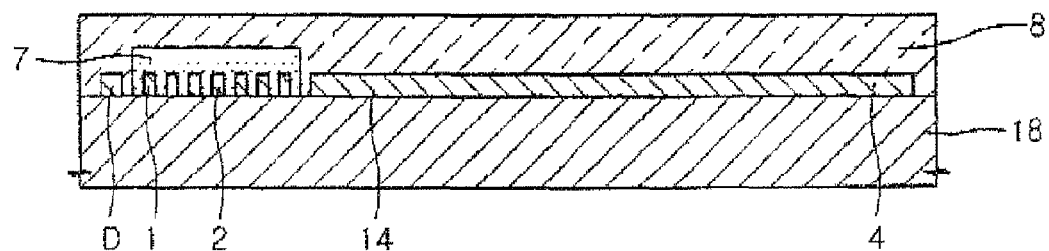
FIG. 6B is a cross-sectional view along line III-III' of FIG. 6A.

FIG. 5A shows, in a plan view, an operation of forming the semiconductor layer 7 over the interdigitated source electrode 1 and drain electrode 2 in the manufacture of the active matrix circuit substrate 30. The semiconductor layer 7 may be formed of an organic semiconductor material, and by a deposition method, an ink-jet printing method, or a screen printing method. FIG. 5B is a cross-sectional view along line II-II' of FIG. 5A. Next, the insulating film 8 may be arranged over the active matrix circuit substrate, as shown in FIG. 6A and FIG. 6B.

Figure 7A:
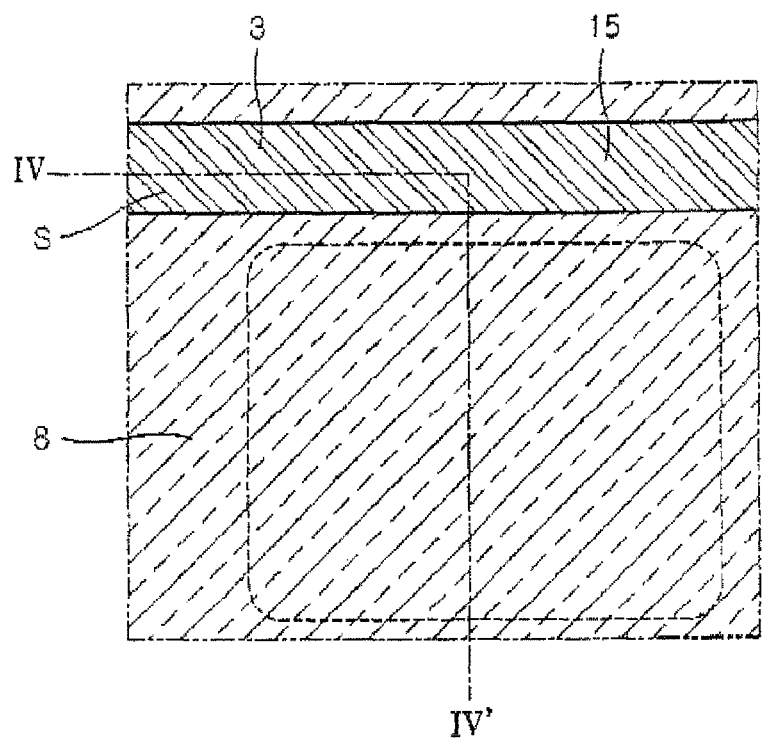
FIG. 7A is a plan view of a pixel for showing an operation of forming a gate electrode, a select line, and a second electrode of the storage capacitor of the pixel of the active matrix display of FIG. 1.
Figure 7B:
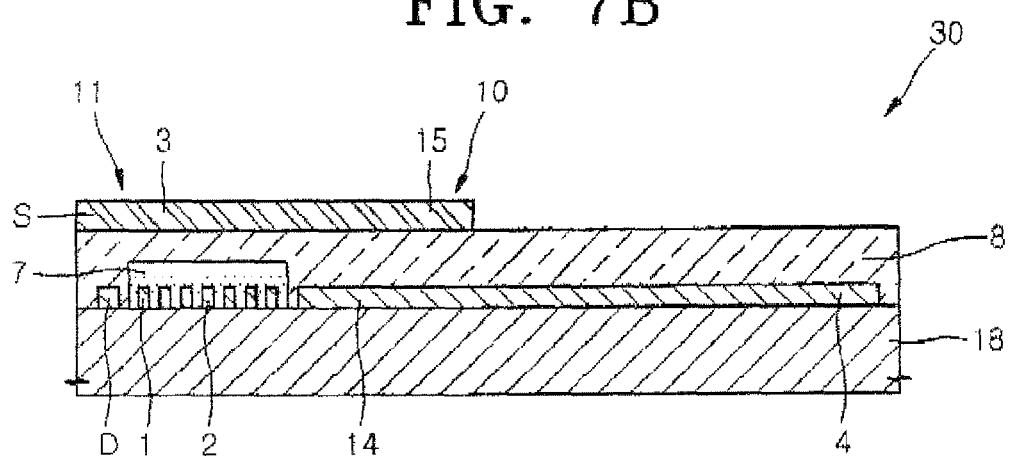
FIG. 7B is a cross-sectional view along line IV-IV' of FIG. 7A.

FIG. 7A shows, in a plan view, an operation of forming the gate electrode 3, the select line S, and the second electrode 15 of the storage capacitor 10 in the manufacture of the active matrix circuit substrate 30. FIG. 7B is a cross-sectional view along line IV-IV' of FIG. 7A. The gate electrode 3, the select line S, and the second electrode 15 of the storage capacitor 10 are incorporated into one line, which is preferably a straight line. The active matrix circuit substrate 30 may be passivated by an insulating material (not shown), and the display substrate 40 may be laminated onto the passivated active matrix circuit substrate 30. The active matrix display of FIG. 1 using the active matrix circuit substrate 30 may be addressed on a pixel-by-pixel basis by applying a negative voltage (e.g., −20V) to each select line S. Accordingly, when the organic TFT 11 turns on, the storage capacitor 10 may be charged with a negative data voltage (e.g., −15V). Non-selected rows may be grounded. The storage capacitor 10 stores a supply voltage that is supplied to the display element 19 during a frame.

As described above, the gate electrode 3, the second electrode 15 of the storage capacitor 10, and the select line S (i.e., at least a part of the select line S) are incorporated into one body. The TFT 11 is arranged beside the storage capacitor 10, and the TFT 11 and the storage capacitor 10 may be arranged in one straight line. This structure does not need extra areas for the select line S and the storage capacitor 10, thus providing a higher fill factor. This straight design and the single line switch are optimally compatible with inkjet printing processes. Only one straight line combines a gate electrode, a second electrode of a storage capacitor, and a select line.

The first substrate 18 may be formed of glass, plastic, or metal foil. A lithography process may be used to pattern the source and drain electrodes 1 and 2 and the first pixel electrode 4. The organic semiconductor layer 7 may be directly patterned by a low temperature process, e.g., inkjet printing. The insulating film 8 may be formed by spin coating or inkjet printing an organic material, or it may be formed by screen printing or evaporation.

Using the inkjet printing technique to pattern the select line S is effective because ink may be printed in the shape of a straight line as described later. However, screen printing, offset printing, or direct evaporation using a shadow mask may also be used.

The selective passivation or the formation of the buffer layer 9 may be carried output by spin coating.

Figure 8:
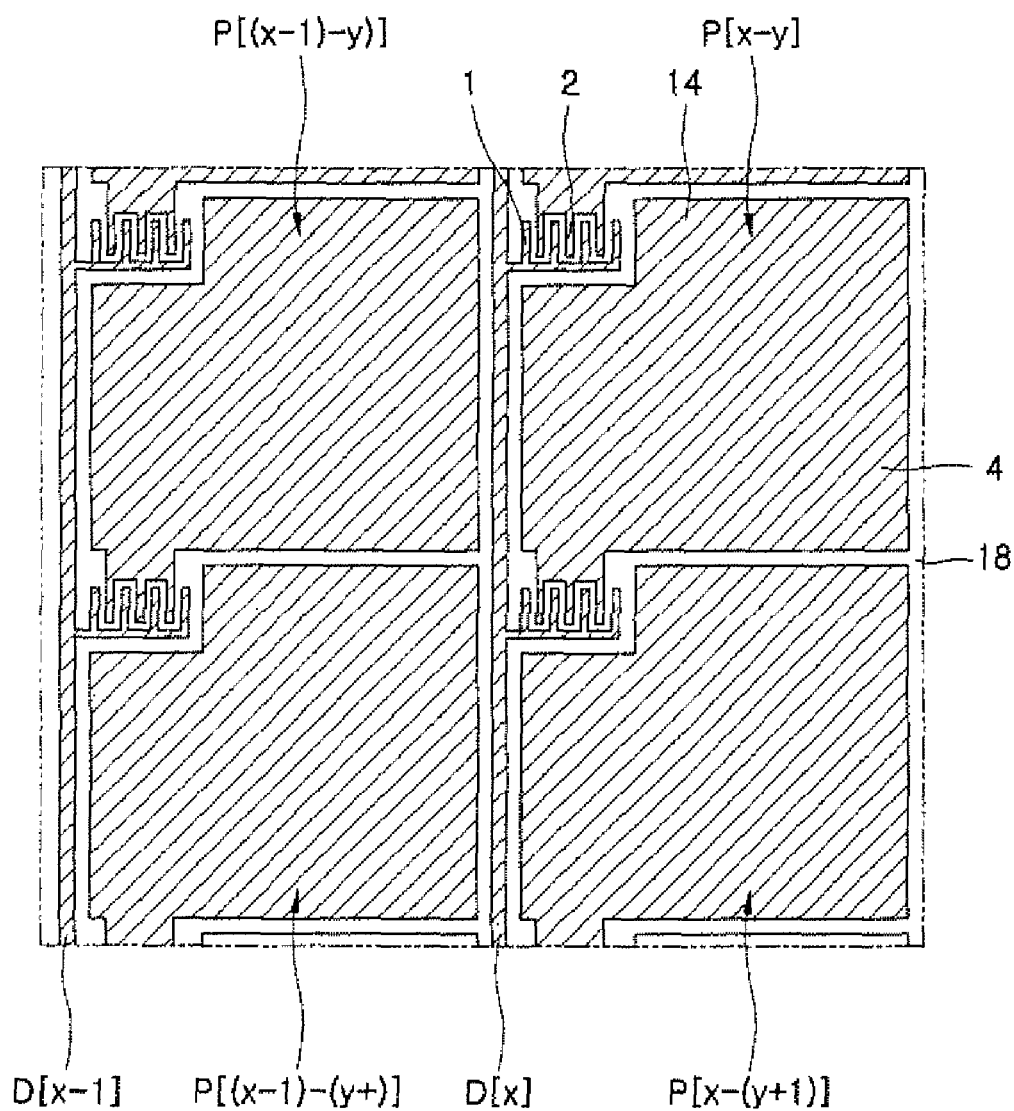
FIG. 8, FIG. 9, and FIG. 10 are plan views of four adjacent pixels of the active matrix display of FIG. 1 according to exemplary embodiments of the present invention.
Figure 9:
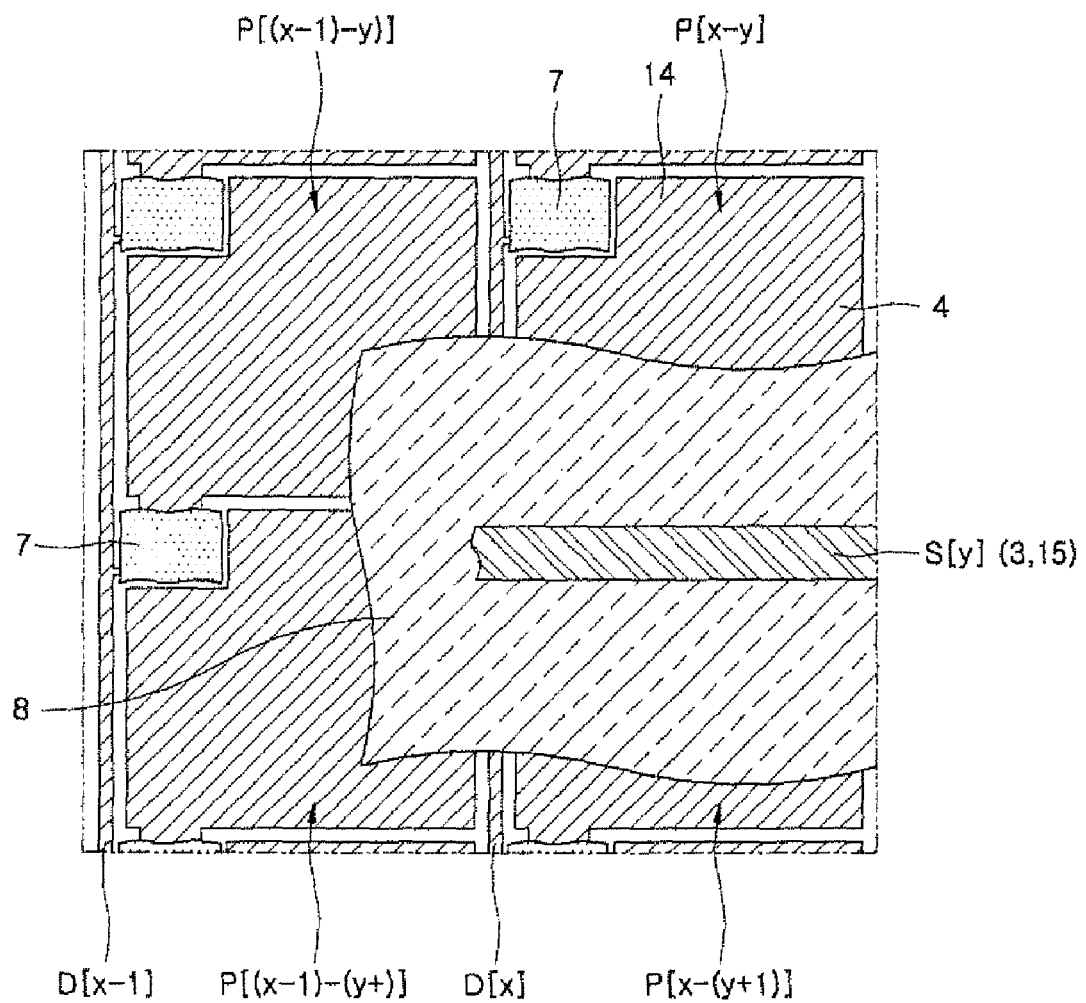
Figure 10:
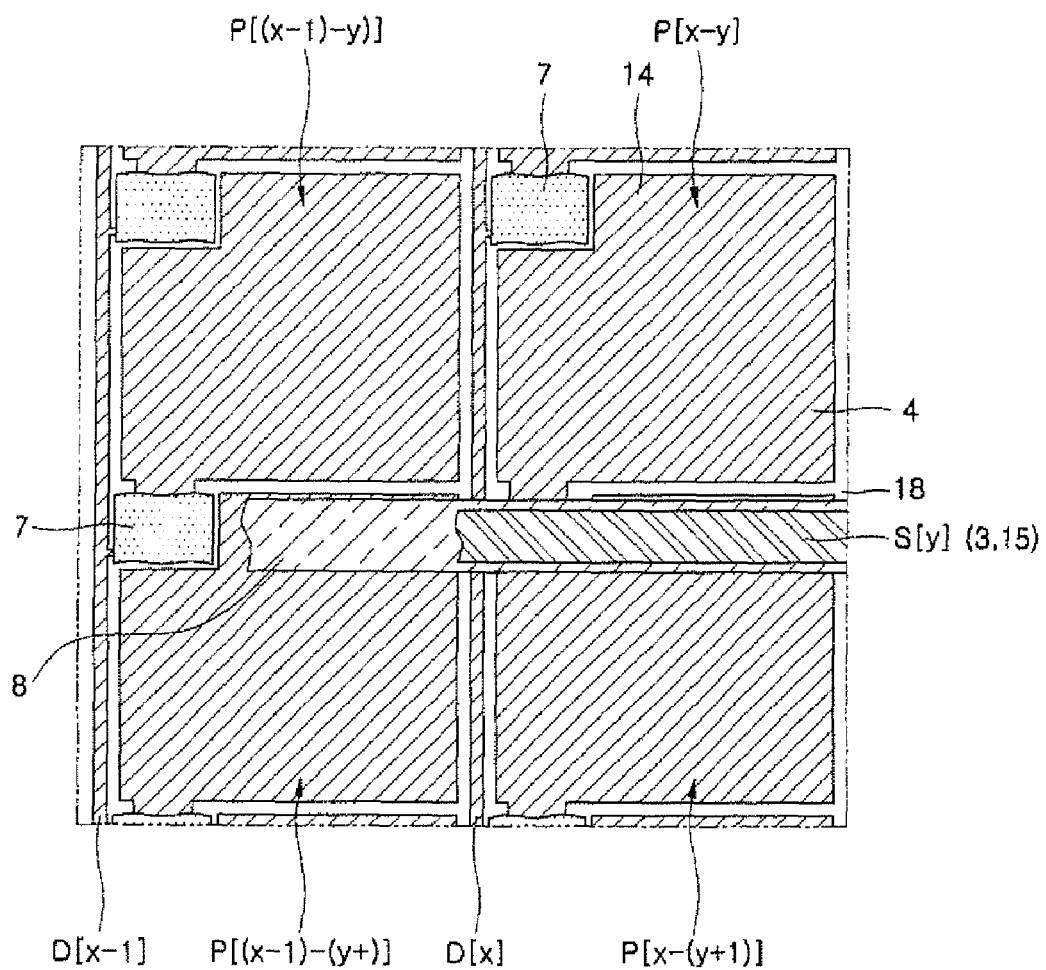

FIG. 8 is a plan view of four adjacent pixels of the active matrix circuit substrate 30. Referring to FIG. 8, each pixel includes the first pixel electrode 4, the source electrode 1, the drain electrode 2, and the first electrode 14 of the storage capacitor 10, and is coupled with a data line D. FIG. 9 and FIG. 10 are plan views of different embodiments of four adjacent pixels that are also shown with the semiconductor layer 7, the insulation film 8, and the select line S.

As shown in FIG. 9 and FIG. 10, the select line S[y] of the pixel P[x-y] is formed in the shape of a straight line, and it serves as both the gate electrode 3 of the pixel P[x-y] and a second electrode 15 of a storage capacitor 10 of a pixel P[x-(y+1)], which is adjacent to the pixel P[x-y].

As shown in FIG. 9, the insulating film 8 may be formed to cover all pixels. Alternatively, as shown in FIG. 10, the insulating film 8 may be formed in the shape of a straight line along the select line S[y]. In this case, as viewed from the cross-section of FIG. 3A, a distance between the first and second pixel electrodes 4 and 13 of the display element 19 decreases, resulting in a higher electrical field. Lower voltages may then be applied to control the pixels. This effect may also be generated when the buffer layer 9 is formed in the shape of a straight line along the select line S[y] in FIG. 3A.

The structure according to exemplary embodiments of the present invention may have the following advantages. First, a select line integrated with a gate electrode and a capacitor results in a higher fill factor.

Second, source and drain patterning to obtain a high performance organic TFT may be achieved by only one masking operation, and the number of following processes may be reduced.

Third, complicated patterning processes are not required, and the gate electrode, an electrode of the capacitor, and the select line may be incorporated into one line.

Fourth, a roll-to-roll process may be utilized.

Fifth, high yield may be obtained through a simple process.

Sixth, no via holes are needed.

Seventh, the organic semiconductor layer, the organic insulating film, the gate electrode, the storage capacitor, and the select line may be patterned by cost-effective inkjet printing.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An active matrix display, comprising:
   a plurality of data lines;
   a plurality of select lines;
   a plurality of pixel circuits each electrically coupled with a data line, a first select line, and a second select line; and
   a plurality of display elements electrically coupled with the pixel circuits, a display element comprising a first pixel electrode and a second pixel electrode,
   wherein the pixel circuits each comprise:
   a thin film transistor having a gate electrode coupled with the first select line and a source electrode and a drain electrode, one of the source electrode and the drain electrode being coupled with the data line; and
   a storage capacitor having a first electrode coupled with the other of the source electrode and the drain electrode and a second electrode coupled with the second select line, and
   wherein the gate electrode of the thin film transistor of a first pixel circuit and the second electrode of the storage capacitor of an adjacent pixel circuit are connected with each other and the entire connected structure of the gate electrode and the second electrode has a straight line shape, and
   wherein the gate electrode of the thin film transistor of the first pixel circuit does not protrude from the select line.

2. The active matrix display of claim 1, wherein the gate electrode of the thin film transistor of the first pixel circuit, the first select line coupled with the gate electrode of the thin film transistor of the first pixel circuit, and the second electrode of the storage capacitor of the adjacent pixel circuit are the same structure having a line shape.

3. The active matrix display of claim 2, wherein the line shape is a straight line shape.

4. The active matrix display of claim 1, wherein the gate electrode of the thin film transistor of the first pixel circuit, a part of the first select line that overlaps the thin film transistor of the first pixel circuit, and the second electrode of the storage capacitor of the adjacent pixel circuit are the same structure having a line shape.

5. The active matrix display of claim 4, wherein the line shape is a straight line shape.

6. The active matrix display of claim 1, wherein the source electrode and the drain electrode are interdigitated.

7. The active matrix display of claim 1, wherein the thin film transistor of the first pixel circuit is adjacent to the storage capacitor of the adjacent pixel circuit.

8. The active matrix display of claim 1, wherein the display element is one of an electrochrome display element, an electrophoretic display element, and a liquid crystal display element.

9. The active matrix display of claim 1, wherein the thin film transistor is an organic thin film transistor.

* * * * *